United States Patent [19]
Takasugi

[11] Patent Number: 4,975,382
[45] Date of Patent: Dec. 4, 1990

[54] METHOD OF MAKING A SELF-ALIGNED FIELD-EFFECT TRANSISTOR BY THE USE OF A DUMMY-GATE

[75] Inventor: Satoru Takasugi, Kyoto, Japan
[73] Assignee: Rohm Co., Ltd., Kyoto, Japan
[21] Appl. No.: 522,514
[22] Filed: May 11, 1990
[30] Foreign Application Priority Data
   May 15, 1989 [JP] Japan ................... 1-120989
[51] Int. Cl.[5] ............................. H01L 21/28
[52] U.S. Cl. ......................... 437/40; 437/29; 437/41; 437/203; 437/912; 437/984; 148/DIG. 53; 148/DIG. 111
[58] Field of Search ............... 437/29, 40, 41, 203, 437/912, 984; 148/DIG. 53, DIG. 111

[56] References Cited

U.S. PATENT DOCUMENTS

| | | |
|---|---|---|
| 4,551,905 | 11/1985 | Chao et al. ............ 437/912 |
| 4,808,545 | 2/1989 | Balasubramanyam et al. ....... 437/41 |

FOREIGN PATENT DOCUMENTS

| | | | |
|---|---|---|---|
| 0128751 | 12/1984 | European Pat. Off. ....... 437/29 |
| 0152167 | 9/1982 | Japan ................. 437/29 |
| 0141780 | 6/1987 | Japan ................. 437/40 |
| 0155770 | 6/1988 | Japan ................. 437/40 |

OTHER PUBLICATIONS

Michael Bolsen, "AZ 5200 Resists for Positive- and Negative Patterning".
K. Yamasaki et al., "Self-Align Implantation for n+-Layer Technology (Saint) for High-Speed GaAs ICs", Electronics Letters, Feb. 4, 1982, vol. 18, No. 3, pp. 119-121.
T. Enoki et al., "Advanced GaAs Saint FET Fabrication Technology and Its Application to Above 9 GHz Frequency Divider", Extended Abstracts of the 17th Conference on Solid State Devices and Materials, Tokyo, 1985, pp. 413-416.
P.C. Chao et al., "Electron-Beam Fabrication of GaAs Low-Noise MESFET's Using a New Trilayer Resist Technique", IEEE Transactions on Electron Devices, vol. ED-32, No. 6, Jun. 1985, pp. 1042-1046.
A. Yasuoka et al., "Registration Accuracy in Focused-Ion-Beam Lithography for the Fabrication of a GaAs FET with a Mushroom Gate", J. Electrochem. Soc., vol. 136, No. 10, Oct. 1989, pp. 3030-3033.
T. Tambo et al., "Low-Noise GaAs MESFET by Dummy-Gate Self-Alignment Technology for MMIC", IEEE GaAs IC Symposium, 1987, pp. 49-52.

Primary Examiner—Brian E. Hearn
Assistant Examiner—Gordon V. Hugo
Attorney, Agent, or Firm—Brumbaugh, Graves, Donohue & Raymond

[57] ABSTRACT

A T-shaped gate of an FET is formed by utilizing the image reverse photolithography process, which includes coating of a semiconductor substrate with a positive resist, initial exposure of an resist outside region, reversal baking, flood exposure of the entire resist layer, and development of the resist layer. The image reverse photolithography process is performed after a dummy gate is formed on the semiconductor substrate. By properly adjusting a light quantity of the flood exposure, a resist pattern can be obtained which has a center hole whose boundary surface is inclined inwardly, and whose bottom surface defines a bottom resist layer thinner than the dummy gate. After removing the dummy gate, a gate material is deposited and then the resist pattern is removed to leave the T-shaped gate.

6 Claims, 8 Drawing Sheets

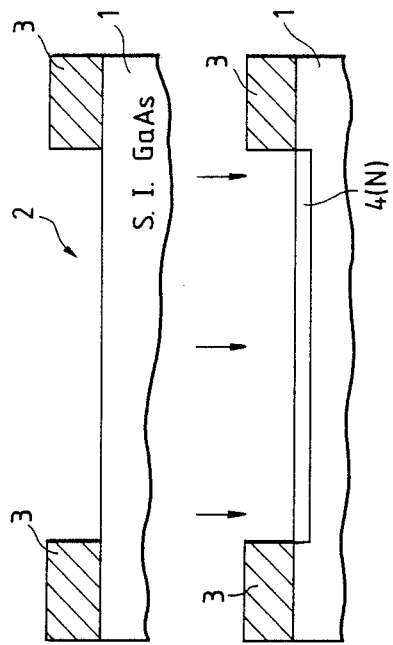
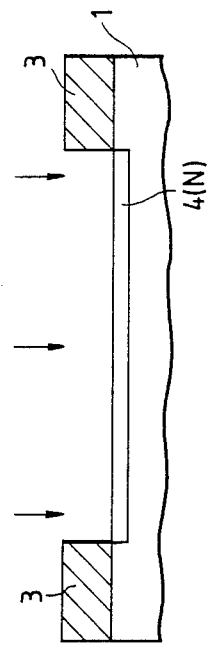
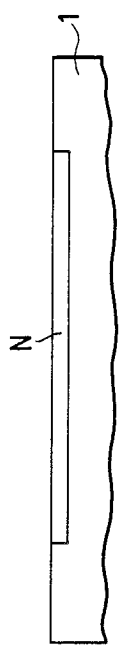
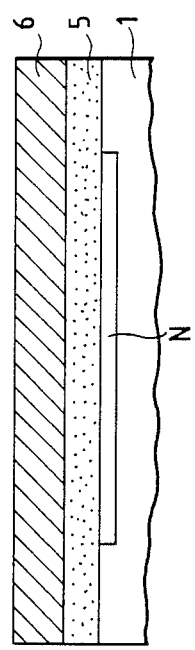
FIG. 1(a)
FIG. 1(b)
FIG. 1(c)
FIG. 1(d)

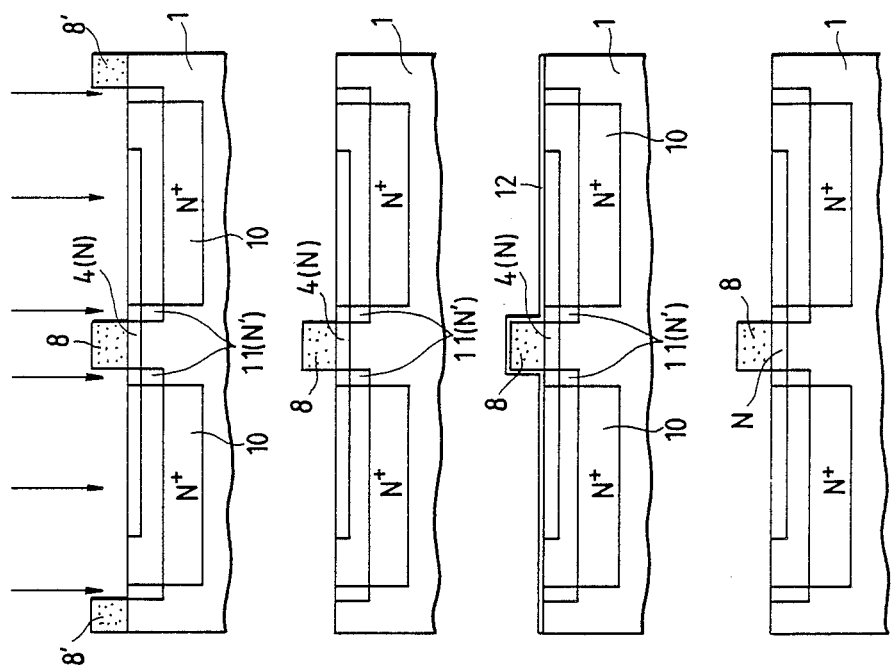

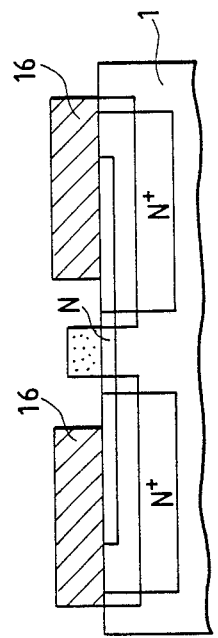
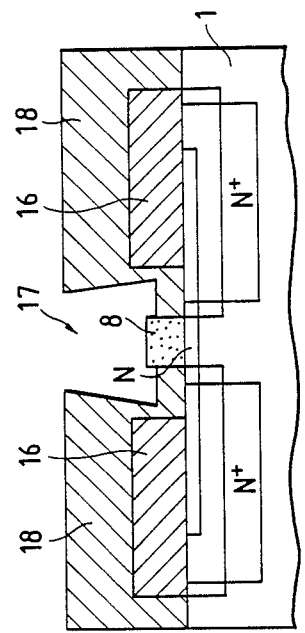
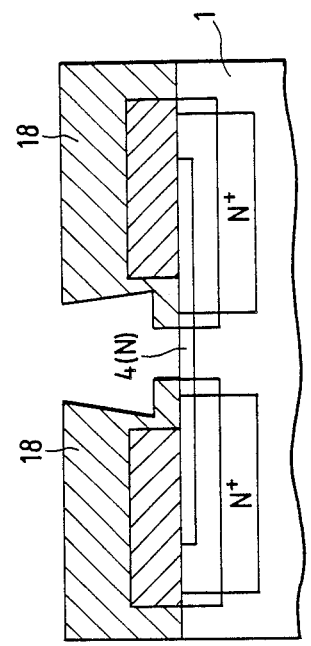
FIG. 1(o)
FIG. 1(p)
FIG. 1(q)

4,975,382

METHOD OF MAKING A SELF-ALIGNED FIELD-EFFECT TRANSISTOR BY THE USE OF A DUMMY-GATE

BACKGROUND OF THE INvENTION

This invention generally relates to a method of forming a metal film on a substrate, and specifically relates to a method of manufacturing a field-effect transistor (FET).

Development of a Schottky-junction-type field-effect transistor using a compound semiconductor such as GaAs has been carried out in the art. As is well known, in order to increase the pperating speed thereof, it is essential to reduce the gate length. However, if the gate length is reduced merely by miniaturizing the gate, then the electrical resistance of the gate is increased, thus interrupting the high speed and low noise operation of the field-effect transistor. Therefore, there have been proposed several methods of forming a gate which is T-shaped or mushroom-shaped in section, i.e., a gate whose lower portion in contact with the semiconductor active layer is narrow while whose upper portion is wide; for instance, a method employing a multi-layer resist and a direct-drawing technique with an electron beam, a method using a focused ion beam lithography, and a method using a dummy gate and a planalization technique in combination.

In addition, in order to realize the high speed operation of the field-effect transistor, it is also essential to reduce the source resistance. Therefore, in order to reduce the source resistance, the structure is generally employed in which the active layers of the source/drain regions are deeper and higher in impurity concentration than the active layer under the gate. However, there arises a problem of the positional shift of the active layers (high concentration layers) of the source/drain regions from the gate, as the gate is miniaturized. Recently, as a countermeasure to this, the FET structure has been extensively employed in which the source/drain regions (high concentration regions) and the gate are self-aligned with each other.

An example of a method of manufacturing such a selfaligned FET is a method in which a refractory gate is used; that is, ion implantation of the high concentration layers is carried out with the refractory gate as a mask, and with the gate left as it is, heat treatment is performed to make the ion implanted layers electrically active. Another example is a method in which a dummy gate is first formed, ion implantation of the high concentration layers is carried out with the dummy gate as a mask, the above-described heat treatment is carried out with the dummy gate or the reverse pattern of the dummy gate left on the semiconductor substrate, and thereafter the aimed gate is formed where the dummy gate was.

In forming the above-described T-shaped or mushroom-shaped gate, the method using a multi-layer resist and a direct-drawing technique using an electron beam, or the method using focused ion beam lithography is disadvantageous in that either must use special equipment such as an electron beam or ion beam direct-drawing device. The method using a dummy gate and a planalization technique in combination also suffers from a difficulty that the process is intricate.

The method using a refractory gate in manufacture of the self-aligned FET is still disadvantageous in that, when the gate is miniaturized, the gate resistance is increased, thus interrupting the high speed and low noise operation of the FET. Furthermore, the method using a dummy gate or its reverse pattern is intricate in process.

SUMMARY OF THE INVENTION

Accordingly, an object of this invention is to eliminate the above-described problems accompanying conventional FET manufacturing methods. More specifically, an object of the invention is to provide a manufacturing method of a field-effect transistor having a gate T-shaped in section which consists of simple manufacturing steps and can employ a variety of gate materials including an ordinary gate material of low resistance.

Another object is to provide a method of forming, with a simple process, a metal structure having a narrow contact area with a substrate and a voluminous top portion.

According to a first aspect of the invention, a method of forming a metal structure on a substrate comprises the steps of:

a first step of forming a dummy structure on a prescribed area of the substrate;

a second step comprising the substeps of:

coating an entire surface of the substrate with a positive resist including a photosensitive agent which reduces dissolving speed of the positive resist to a developer liquid when subjected to initial exposure of a prescribed light quantity and prescribed heat treatment;

performing the initial exposure in such a manner that only an outer area of the resist other than a dummy structure area and an area surrounding the dummy structure area is exposed;

heat-treating the resist to stabilize the outer area thereof;

performing flood exposure of a prescribed light quantity in such a manner that an entire resist area is exposed; and developing the resist to form a metal structure forming resist pattern having a hole whose boundary surface is inclined inwardly, whose top opening completely contains the dummy structure area in a top view, and whose bottom surface defines a bottom resist layer being thinner than the dummy structure so that the dummy structure is projected from the bottom resist layer;

a third step of removing the dummy structure from the substrate by etching;

a fourth step of depositing metal on an entire surface of the substrate through the resist pattern so that a metal layer becomes thicker than the bottom resist layer; and a fifth step of removing the resist pattern to leave the metal structure on the substrate.

In the above method, the metal film may be a gate electrode of a field-effect transistor, and the dummy structure may be a dummy gate.

According to a second aspect of the invention, a manufacturing method of a field-effect transistor comprises the steps of:

a first step of forming a first ion-implanted region to become a first semiconductor active layer having a prescribed conduction type in a prescribed region of a semiconductor substrate;

a second step comprising the substeps of:

forming a uniform dummy gate layer on the substrate;

forming a dummy gate forming resist pattern on the dummy gate layer in a first area corresponding to a gate and in a second area other than the first area and an area of a second semiconductor active layer; and etching the dummy gate layer through the dummy gate forming resist pattern to form a dummy gate pattern consisting of a dummy gate and a temporary cover film beneath a part of the resist pattern in the second area;

a third step of forming a second ion-implanted region to become the second semiconductor active layer having an impurity concentration higher than the first semiconductor active layer by ion implantation with the dummy gate forming resist pattern as a mask, and then removing the dummy gate forming resist pattern;

a fourth step of removing the temporary cover film;

a fifth step of activating the first and second ion-implanted regions by heat treatment;

a sixth step of forming a pair of ohmic source and drain electrodes on the second semiconductor active layer with a predetermined gap between the dummy gate and each of the ohmic electrodes;

a seventh step comprising the substeps of:

coating an entire surface of the substrate with a positive resist including a photosensitive agent which reduces dissolving speed of the positive resist to a developer liquid when subjected to initial exposure of a prescribed light quantity and prescribed heat treatment;

performing the initial exposure in such a manner that only an outer area of the positive resist other than a dummy gate area and an area surrounding the dummy gate area is exposed;

heat-treating the positive resist to stabilize the outer area thereof;

performing flood exposure of a prescribed light quantity in such a manner that an entire positive resist area is exposed;

developing the positive resist to form gate forming resist pattern having a hole whose boundary surface is inclined inwardly, whose top opening completely contains the dummy gate area in a top view, and whose bottom surface defines a bottom resist layer being thinner than the dummy gate so that the dummy gate is projected from the bottom resist layer; and removing the dummy gate from the substrate by etching;

an eighth step of depositing gate material on an entire surface of the substrate through the gate forming resist pattern so that a gate material layer is thicker than the bottom resist layer, and removing the gate forming resist pattern to leave the gate on the substrate.

In the method according to the first aspect of the invention, the dummy gate is used in combination with the gate forming resist pattern having the hole whose bottom surface defines the bottom resist layer with a prescribed thickness, and whose boundary surface is inclined inwardly, whereby the gate T-shaped in section can be readily formed with high reproducibility.

The method according to the second aspect of the invention, in which the gate self-aligned with the low resistance semiconductor active layers of the source/-drain regions is formed, can realize the manufacturing process which is simple and high in reproducibility, and also can reduce the gate resistance.

DETAILED DESCRIPTION OF THE PREFERRED EMBODIMENTS

Preferred embodiments of the invention will be described with reference to the accompanying drawings.

Figure 1E:
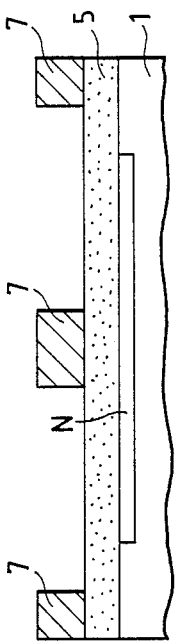
FIGS. 1(a) through 1(s) are sectional views for a description of an FET manufacturing method according to an embodiment of this invention.
Figure 1F:
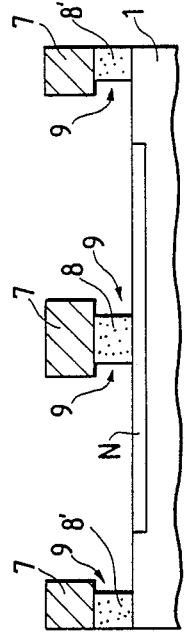
Figure 1G:
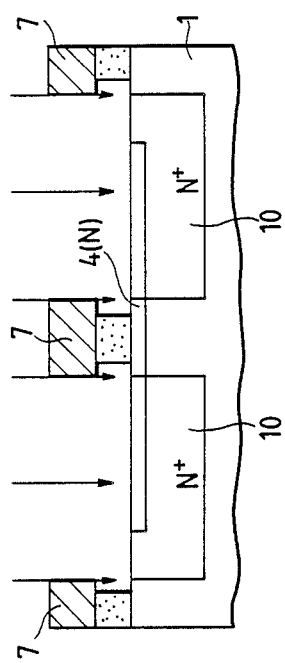
Figure 1H:
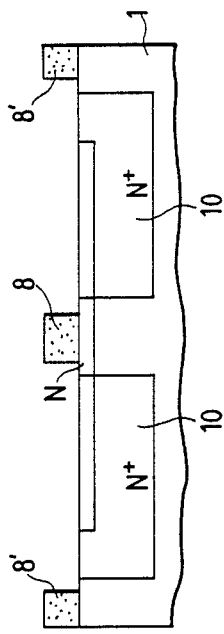
Figure 1M:
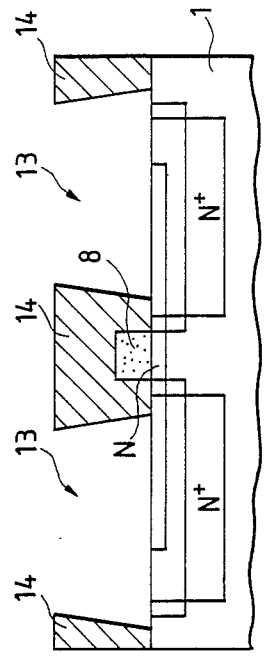
Figure 1N:
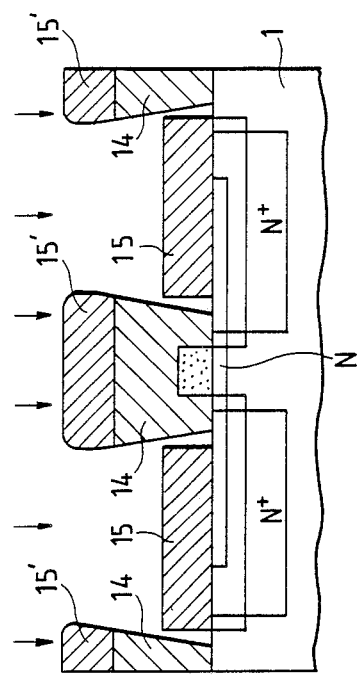
Figures 1R, 1S:
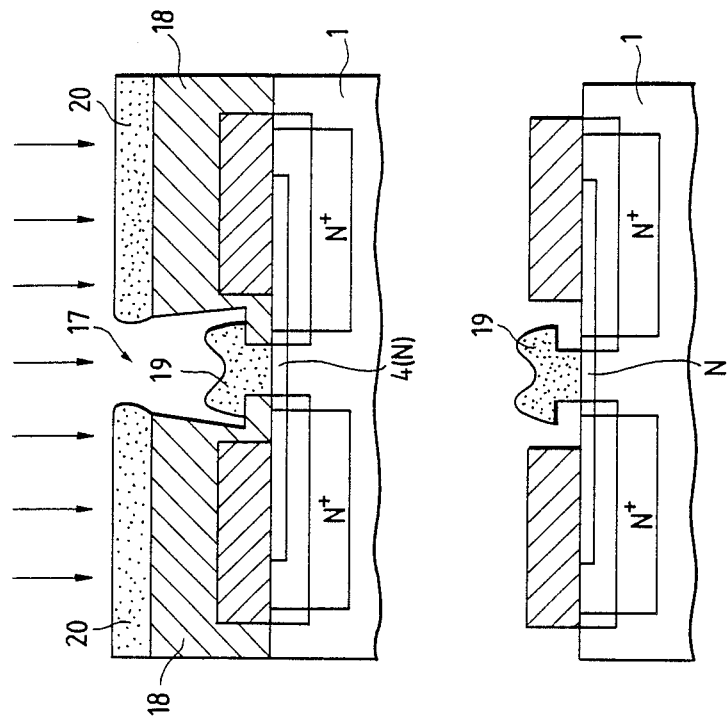

FIGS. 1(a) through 1(s) are sectional diagrams showing manufacturing steps in one embodiment of an FET manufacturing method according to the invention.

First, an N-type layer forming resist pattern 3 having a hole 2 predetermined in size is formed on a semi-insulating GaAs (S.I. GaAs) substrate 1 (FIG. 1(a)). An N-type layer 4 is formed in the substrate 1 by implanting ions such as Si or Se (as indicated by the arrows) with the resist pattern 3 (FIG. 1(b)) as a mask. The N layer 4 thus formed is a layer to become a first semiconductor active layer of an FET. The ion implanting conditions are controlled to give a predetermined conduction type to the layer 4. The N layer forming resist pattern 3 is removed with a peeling solution or the like (FIG. 1(c)).

A dummy gate layer 5 is formed on the semi-insulating GaAs substrate 1 thus processed. More specifically, the dummy gate layer 5 is formed by depositing dummy gate material on the substrate 1 by, e.g., sputtering or plasma CVD. The dummy gate material is, for instance, $Si_3N_4$, SiON or $SiO_2$ which can be used as an anneal protective film which is generally used to activate an N-type layer or $N^+$-type layer is a later process.

Under this condition, a resist layer 6 is formed on the above-described dummy gate layer 5 (FIG. 1(d)), and is then exposed through a photomask (not shown) and developed, so that a dummy gate forming resist pattern 7 is formed on the dummy gate layer 5 (FIG. 1(e)). The dummy gate forming resist pattern 7 is so formed as to cover the region of the dummy gate layer 5 which is on the first semiconductor active layer (the N layer 4) and corresponds to the gate, and the regions other than the regions under which a second semiconductor active layer (described later) of the FET is to be formed.

The dummy gate layer 5 is subjected to etching through the dummy gate forming resist pattern 7 to form a dummy. gate pattern including a dummy gate 8 and temporary cover films 8' which cover the regions other than the regions of the substrate 1 where the second semiconductor active layer is to be formed (FIG. 1(f)). The dummy gate layer 5 is etched by, e.g., RIE (Reactive Ion Etching) or wet etching with hydrofluoric acid. The side walls of the portions of the dummy gate layer 5 which are covered by the dummy gate forming resist pattern 7 are side-etched as indicated by numeral 9. An amount of the side etching 9 can be controlled by adjusting the etching conditions.

By controlling the amount of the side etching 9, a short gate 0.5 μm or less in length can be formed. Thus, according to the method described above, a minute gate can be readily formed when compared with a conventional method in which gate material is deposited over a resist pattern having an open gate area and then the unnecessary deposit is removed by a lift-off method.

Ions of Si+ or the like are implanted (as indicated by the arrows), with high concentration, into the semiinsulating GaAs substrate processed as shown in FIG. 1(f) beyond the N layer 4, to form N+-type layers 10 in the substrate 1 (FIG. 1(g)). The N layer 10 is the region to become the second semiconductor active layer. Thereafter, the dummy gate forming resist pattern 7 is removed with a peeling solution or the like (FIG. 1(h)).

FIG. 1(i) shows a manufacturing step which is inserted between the manufacturing steps shown in FIGS. 1(h) and 1(j) when necessary. An N' layer 11 is formed in the semi insulating GaAs substrate 1 processed in the manufacturing step shown in FIG. 1(h). The N' layer 11 has an ion concentration and a depth each of which is between those of the N layer 4 and the N. layer 10, and it is formed by implanting ions of Si+ or the like (as indicated by the arrows) (FIG. 1(i)).

As shown in FIG. 1(h), the distance between the dummy gate 8 and the N. layer 10 formed in the step shown in FIG. 1(g) approximately corresponds to the amount of the side etching 9 which is performed in the step shown in FIG. 1(f). A gate (described later) is formed in such a manner that its substrate-side portion is located at the same position as the dummy gate 8 and has the same size as the latter. Accordingly, if the distance between the N+ layer 10 and the dummy gate 8 is excessively large in FIG. 1(h), then in the manufactured FET the series resistance added by the surface depletion layer is increased. When the amount of the side etching 9 is small in the step shown in FIG. 1(f), the edges of the dummy gate forming resist pattern 7 approximately aligns with those of the dummy gate 8, and therefore it is unnecessary to form the N' layer 11 in the step shown in FIG. 1(i). However, in the case where the amount of the side etching is increased in the step shown in FIG. 1(f) in order to form the smaller dummy gate 8, it is preferable to form the N' layer 11 in the step shown in FIG. 1(i).

The part of the dummy gate pattern formed on the regions of the substrate 1 other than the N layer 4, namely, the temporary cover films 8' are removed by etching in the same manner as in the step shown in FIG. 1(f) (FIG. 1(j)). In this operation, in order to prevent the dummy gate 8 on the N layer 4 from being removed, only the dummy gate 8 is preliminarily covered with a dummy gate covering resist pattern (not shown), and then, after the etching, the dummy gate covering resist pattern is removed by using a peeling solution or the like.

An anneal protective film 12 is formed on the entire surface of the semi-insulative GaAs substrate 1 processed as shown in FIG. 1(j) (FIG. 1(k)). The anneal protective film 12 may be composed of material which is generally used to activate an N-type layer or N+-type layer. That is, the film 12 for encapsulation of annealing is formed, for instance, by depositing $Si_3N_4$, SiON or $SiO_2$ on the entire surface of the substrate 1 by sputtering or plasma CVD. The film 12 for encapsulation of annealing is formed so as to be much thinner than the dummy gate 8.

Thereafter, the N layer 4, the N+ layer and the N' layer 11 are activated by annealing, and then the anneal protective film 12 is removed (FIG. 1(l)). More specifically, the anneal protective film 12 is removed by, e.g., RIE, plasma etching or wet etching similarly as in the etching of the dummy gate layer 5 in the step shown in FIG. 1(f)).

In the above-described embodiment, the dummy gate 8 is formed in the manufacturing step shown in FIG. 1(f). However, it may be formed as follows: In advance, the N layer 4 and the N+ layer 10, and preferably the N' layer 11 are formed in the substrate 1, and then, after formation of the above-described film 12 for encapsulation of annealing on the substrate 1, they are subjected to annealing; and thereafter the dummy gate 8 is formed on the N layer 4 as shown in FIG. 1(l).

An electrode forming resist pattern 14 having a pair of holes 13, which are spaced a predetermined distance from the dummy gate, is formed on the semi-insulative GaAs substrate 1 processed as shown in FIG. 1(l) (FIG. 1(m)).

Under this condition, metal is deposited by vacuum evaporation on the substrate 1 through the electrode forming resist pattern 14 (as indicated by the arrows) to form metal films 15 and 15' (FIG. 1(n)). The metal is a gold-germanium alloy for instance. The metal films 15 should be thinner than the electrode forming resist pattern 14 so that the metal films 15 formed directly on the substrate 1 may not be joined to the metal film 15' formed on the electrode forming resist pattern 14.

Thereafter, the electrode forming resist pattern 14 is removed with, e.g., a peeling solution, and then the resultant structure is subjected to alloying, so that a pair of electrodes 16 are formed as shown in FIG. 1(o). Preferably, the boundary of the holes 13 should be inclined inwardly so that, when the electrode forming resist pattern 14 is removed, the metal film 15 on the resist pattern 14 is readily lifted off. The electrodes 16 thus formed are ohmic electrodes.

A gate forming resist pattern 18 is formed on the semi-insulative GaAs substrate 1 processed as shown in FIG. 1(o) in such a manner that the resist layer directly on the substrate 1 is thinner than the dummy gate 8 and has a hole 17 exposing the dummy gate 8 only (FIG. 1(p)).

The gate forming resist pattern 18 can be formed by the image reverse photolithography process well known in the art. First, an ordinary image reverse photolithography process will be described with reference to FIG. 2.

Figure 2:
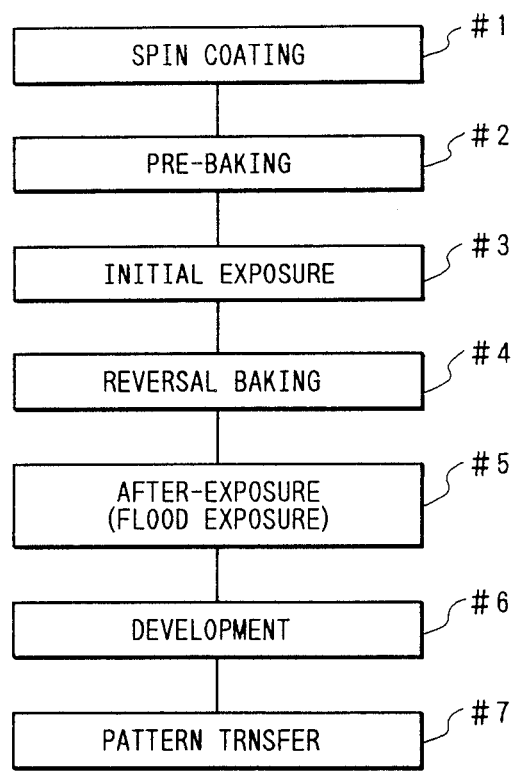
FIG. 2 is a diagram outlining an image reverse photolithography process employed in the invention.

As shown in FIG. 2, a resist layer is formed on a substrate by spin coating in Step #1. It is pre-baked in Step #2, and then in Step #3 a first exposure (or initial exposure) is carried out so that the resist layer is exposed through a photomask to weak light from a light source. Thus, the photomask pattern is transferred onto the resist layer. In Step #4, reversal baking (prescribed heat treatment) is carried out to stabilize the region of the resist layer which was exposed in the initial exposure. With this treatment, the photosensitive agent added to the resist acts to reduce the rate of dissolution of the resist with respect to a developing solution in the exposed region. In Step #5, the entire surface of the resist layer is subjected to a second exposure or afterexposure (flood exposure), so as to increase the rate of dissolution of the resist to an alkaline developing solution in the portions of the resist layer which was not exposed in Step #3. In Step #6, development is carried out to form the resist pattern on the substrate. In Step #7, the aimed pattern is formed on the substrate by a surface treatment such as vacuum evaporation, etching and ion implantation.

One example of a method of forming the gate forming resist pattern 18 as shown in FIG. 1(p) will described in accordance with the general image reverse photolithography process described above with reference to FIG. 2.

In Step #1, a resist layer is formed by spin coating on the entire surface of the semi-insulative GaAs substrate which has been treated as shown in FIG. 1(o). In Step #2, prebaking is carried out; and in Step #3, initial exposure is performed. The initial exposure, or first exposure, is carried out by using a photomask which is so shaped as to expose the resist in the regions other than the region consisting of the dummy gate area and the area surrounding the dummy gate 8 but being not so wide as to reach the electrodes 16, and therefore as to expose all the resist directly in contact with the surface of the electrodes 16. In Step #4, reversal baking is carried out to stabilize the portion which was exposed in the above-described initial exposure. Next, in Step #5, the entire surface of the resist is subjected to flood exposure. In the flood exposure, the amount of exposure is controlled to the extent that the exposure light reaches the top of the dummy gate 8 but not the surface of the semi-insulating GaAs substrate 1. For instance, the amount of exposure is limited to one half or one third of that in an ordinary flood exposure. In Step #6, development is carried out to form the gate forming resist pattern 18 having a hole 17 as shown in FIG. 1(p). The part of the resist layer near the dummy gate 8 and forming the bottom of the hole 17 is made thinner so that the dummy gate 8 is protruded from the bottom of the hole 17. Since the boundary surface of the hole 17 is formed in accordance with the initial exposure, it is inclined inwardly.

After the formation of the gate forming resist pattern 18, the dummy gate 8 is removed by, e.g., plasma etching or wet etching (FIG. 1(q)).

A gate material is deposited by, e.g., vacuum evaporation or sputtering on the semi-insulating GaAs substrate 1, which has been treated as shown in FIG. 1(q), in such a manner that thickness of the gate material on the N layer 4 is larger than that of the resist layer of the bottom of the hole 17 (FIG. 1(r)). FIG. 1(r) shows the vacuum evaporation of the gate material which is carried out perpendicularly to the surface of the semi-insulating GaAs substrate 1. The gate material is deposited in the space which was produced in the hole 17 by the removal of the dummy gate 8, and on the thinner portion of the resist pattern 18 in the vicinity of the space, thus forming a gate 19. A gate material layer 20 is also formed on the thicker portions of the gate forming resist pattern 18 by the vacuum evapolation; however, the gate material layer 20 will not join the gate 19 because the boundary surface of the hole 17 is inclined inwardly as was described above.

Under this condition, the gate forming resist pattern 18 is removed by using a peeling solution or the like, as a result of which the T-shaped gate 19 is left. As shown in FIG. 1(s), the lower end of the T-shaped gate is connected to the N layer 4, and the upper portion is wider than the N layer 4.

A modification of the above FET manufacturing method will now be described with reference to FIGS. 3(a) through 3(c), which correspond to FIGS. 1(e) through 1(g), respectively.

Figure 3A:
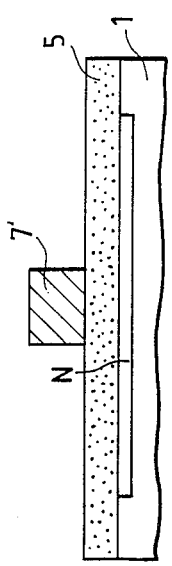
FIGS. 3(a) through 3(c) are sectional views for a description of part of an FET manufacturing method according to a modification of the method of FIGS. 1(a) through 1(s).

After completion of the step of FIG. 1(d), the resist layer 6 is exposed through a photomask (not shown) and then developed, so that a dummy gate forming resist pattern 7' is formed so as to cover only the region of the dummy gate layer 5 which corresponds to the gate (FIG. 3(a)).

Figure 3B:
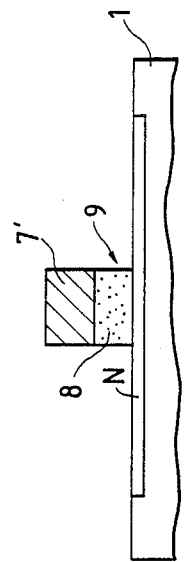

The dummy gate layer 5 is then subjected to etching through the dummy gate forming resist pattern 7, to form a dummy gate 8 (FIG. 3(b)). The dummy gate layer 5 is etching by, e.g., RIE, plamsa etching or wet etching with hydrofluoric acid. Although FIG. 3(b) is drawn as the case where substantially no side-etching 9 is performed, the side-etching 9 may be conducted to reduce the gate length in the same manner as in the process of FIG. 1(f).

Figure 3C:
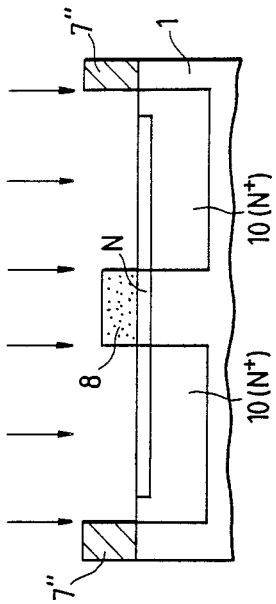

After removal of the dummy gate forming resist pattern 7' with a peeling solution, another resist pattern 7" is formed outside the N layer 4 as shown in FIG. 3(c) using a proper photomask (not shown). Then, using the dummy gate 8 and the resist pattern 7" as a mask, ions of $Si^+$ or the like are implanted (as indicated by the arrows), with high concentration, into the semi-insulating GaAs substrate 1 beyond the N layer 4, to form $N^+$-type layers 10 which are the regions to become the second semiconductor active layers. Thereafter, the resist pattern 7" is removed with a peeling solution.

This modification has an advantage that since the temporary cover film 8' of the embodiment of FIG. 1 is not formed, the etching process for removing the film 8' is eliminated, which simplifies the manufacturing method. On the other hand, in this modification, the N' layer 11 cannot be formed.

Although the above description is devoted to the self-aligned GaAs MESFET manufacturing method, the gate forming method employed in the above manufacturing method is also applicable to other metal structure fabrications. For instance, a metal structure such as a T-shaped metal structure and an inverted-L-shaped metal structure, which has a small contact area with the substrate and has a voluminous portion remote from the substrate, can be formed by, e.g., vacuum evaporation of metal through a resist pattern which is formed by the above-described image reverse photolithography process.

For example, a dummy structure which is smaller than the region which is not exposed during initial exposure in the image reverse photolithography process is formed in advance on a substrate, on which a resist layer is formed later. Formation of the dummy structure at the center of such a region provides a resist pattern to form a metal structure T-shaped in section as shown in FIG. 1(s). When the dummy structure is formed in such a region in such a manner that it is shifted from the center, then a resist pattern to form an inverted-L-shaped metal structure can be formed.

In the image reverse photolithography process, flood exposure is carried out in such a manner that the part of the resist layer not exposed in the initial exposure and remaining on the substrate becomes thinner than the height of the dummy structure. The distance between the upper voluminous portion of the metal structure and the substrate can be controlled by adjusting the thickness of the initially non-exposed part of the resist. The upper voluminous portion of the metal structure can be formed by depositing metal by vacuum evaporation in such a manner that its part in direct contact with the substrate is thicker than the thinnest part of the resist layer.

The image reverse photolithography process can form a resist pattern having a hole whose boundary surface is inclined inwardly as shown in FIG. 1(q), and therefore the metal structure shaped as described above can be readily formed.

As was described above, according to the invention, a gate T-shaped in section can be readily formed with high reproducibility, and even when length of the gate is reduced, the gate resistance can be maintained low. Furthermore, since the gate electrode can be formed after the ohmic electrodes have been formed, the gate electrode will not be affected by the heat treatment which is carried out for alloying the interface of the ohmic electrodes and the semiconductor active layer. Furthermore, a hole is formed in the resist pattern formed by the image reverse photolithography process in such a manner that the boundary surface of the hole is inclined inwardly, and therefore the resist can easily be removed, and an unnecessary metal film can readily be lifted off.

Moreover, a field-effect transistor is manufactured in which a gate electrode is formed in self-alignment with the source/drain regions low in resistance. Therefore, it is unnecessary to use a refractory gate material higher in resistance than ordinary metal, and a gate T-shaped in section can readily be formed with high reproducibility.

What is claimed is:

1. A method of forming a metal structure on a substrate, comprising the steps of:
   a first step of forming a dummy structure on a prescribed area of the substrate;
   a second step comprising the substeps of:
   coating an entire surface of the substrate with a positive resist including a photosensitive agent which reduces dissolving speed of the positive resist to a developer liquid when subjected to initial exposure of a prescribed light quantity and prescribed heat treatment;
   performing the initial exposure in such a manner that only an outer area of the resist other than a dummy structure area and an area surrounding the dummy structure area is exposed;
   heat-treating the resist to stabilize the outer area thereof;
   performing flood exposure of a prescribed light quantity in such a manner that an entire resist area is exposed; and
   developing the resist to form a metal structure forming resist pattern having a hole whose boundary surface is inclined inwardly, whose top opening completely contains the dummy structure area in a top view, and whose bottom surface defines a bottom resist layer being thinner than the dummy structure so that the dummy structure is projected from the bottom resist layer;
   a third step of removing the dummy structure from the substrate by etching;
   a fourth step of depositing metal on an entire surface of the substrate through the resist pattern so that a metal layer becomes thicker than the bottom resist layer; and
   a fifth step of removing the resist pattern to leave the metal structure on the substrate.

2. The method according to claim 1, wherein the metal structure is an electrode, and the substrate is a semiconductor substrate.

3. The method according to claim 2, wherein the electrode is a gate electrode of a field-effect transistor, and the dummy structure is a dummy gate.

4. A manufacturing method of a field-effect transistor, comprising the steps of:
   a first step of forming a first ion-implanted region to become a first semiconductor active layer having a prescribed conduction type in a prescribed region of a semiconductor substrate;
   a second step comprising the substeps of:
   forming a uniform dummy gate layer on the substrate;
   forming a dummy gate forming resist pattern on the dummy gate layer in a first area corresponding to a gate and in a second area other than the first area and an area of a second semiconductor active layer; and
   etching the dummy gate layer through the dummy gate forming resist pattern to form a dummy gate pattern consisting of a dummy gate and a temporary cover film beneath a part of the resist pattern in the second area;
   a third step of forming a second ion-implanted region to become the second semiconductor active layer having an impurity concentration higher than the first semiconductor active layer by ion implantation with the dummy gate forming resist pattern as a mask, and then removing the dummy gate forming resist pattern;
   a fourth step of removing the temporary cover film;
   a fifth step of activating the first and second ionimplanted regions by heat treatment;
   a sixth step of forming a pair of ohmic source and drain electrodes on the second semiconductor active layer with a predetermined gap between the dummy gate and each of the ohmic electrodes;
   a seventh step comprising the substeps of:
   coating an entire surface of the substrate with a positive resist including a photosensitive agent which reduces dissolving speed of the positive resist to a developer liquid when subjected to initial exposure of a prescribed light quantity and prescribed heat treatment;
   performing the initial exposure in such a manner that only an outer area of the positive resist other than a dummy gate area and an area surrounding the dummy gate area is exposed;
   heat-treating the positive resist to stabilize the outer area thereof;
   performing flood exposure of a prescribed light quantity in such a manner that an entire positive resist area is exposed;
   developing the positive resist to form gate forming resist pattern having a hole whose boundary surface is inclined inwardly, whose top opening completely contains the dummy gate area in a top view, and whose bottom surface defines a bottom resist layer being thinner than the dummy gate so that the dummy gate is projected from the bottom resist layer; and
   removing the dummy gate from the substrate by etching;
   an eighth step of depositing gate material on an entire surface of the substrate through the gate forming resist pattern so that a gate material layer is thicker than the bottom resist layer, and removing the gate forming resist pattern to leave the gate on the substrate.

5. The method according to claim 4, further comprising, between the third and fourth steps, the step of forming a third ion-implanted region to become a third semiconductor active layer having an impurity concentration and a depth each of which is between those of the first and second semiconductor active layers by ion-implantation with the dummy gate pattern as a mask.

6. A manufacturing method of a field-effect transistor, comprising the steps of:
a first step of forming a first ion-implanted region to become a first semiconductor active layer having a prescribed conduction type in a prescribed region of a semiconductor substrate;
a second step comprising the substeps of:
 forming a uniform dummy gate layer on the substrate;
 forming a dummy gate forming resist pattern on the dummy gate layer in a first area corresponding to a gate; and
 etching the dummy gate layer through the dummy gate forming resist pattern to form a dummy gate;
 removing the dummy gate forming resist pattern; and
 forming a resist pattern on the substrate in a second area other than the first ion-implanted region;
a third step of forming a second ion-implanted region to become the second semiconductor active layer having an impurity concentration higher than the first semiconductor active layer by ion implantation with the dummy gate and the resist pattern in the second area as a mask;
a fourth step of removing the resist pattern in the second area;
a fifth step of activating the first and second ionimplanted regions by heat treatment;
a sixth step of forming a pair of ohmic source and drain electrodes on the second semiconductor active layer with a predetermined gap between the dummy gate and each of the ohmic electrodes;
a seventh step comprising the substeps of:
 coating an entire surface of the substrate with a positive resist including a photosensitive agent which reduces dissolving speed of the positive resist to a developer liquid when subjected to initial exposure of a prescribed light quantity and prescribed heat treatment;
 performing the initial exposure in such a manner that only an outer area of the positive resist other than a dummy gate area and an area surrounding the dummy gate area is exposed;
 heat-treating the positive resist to stabilize the outer area thereof;
 performing flood exposure of a prescribed light quantity in such a manner that an entire positive resist area is exposed;
 developing the positive resist to form gate forming resist pattern having a hole whose boundary surface is inclined inwardly, whose top opening completely contains the dummy gate area in a top view, and whose bottom surface defines a bottom resist layer being thinner than the dummy gate so that the dummy gate is projected from the bottom resist layer; and
 removing the dummy gate from the substrate by etching;
an eighth step of depositing gate material on an entire surface of the substrate through the gate forming resist pattern so that a gate material layer is thicker than the bottom resist layer, and removing the gate forming resist pattern to leave the gate on the substrate.

* * * * *

UNITED STATES PATENT AND TRADEMARK OFFICE
CERTIFICATE OF CORRECTION

PATENT NO. : 4,975,382
DATED : December 4, 1990
INVENTOR(S) : Satoru Takasugi

It is certified that error appears in the above-identified patent and that said Letters Patent is hereby corrected as shown below:

Column 4, line 41: The word "is" should read --in--.

Column 5, line 9: The words "N layer" should read --$N^+$ layer--; line 19: The words "N. layer" should read --$N^+$ layer--; line 23: The words "N. layer" should read --$N^+$ layer--.

Column 7, line 2: The word "will" should read --will be--; line 52: The word "evapolation" should read --evaporation--.

Column 8, line 5: The numeral "7" should read --7'--; line 7: The words "is etching" should read --is etched--; line 7: The word "plamsa" should read --plasma--.

Column 10, line 28: The word "ionim-" should read --ion-im- --.

Column 11, line 32: The word "ionim-" should read --ion-im- --.

Signed and Sealed this

Fourth Day of August, 1992

*Attest:*

DOUGLAS B. COMER

*Attesting Officer*     *Acting Commissioner of Patents and Trademarks*